US012658250B2

(12) United States Patent
You et al.

(10) Patent No.: US 12,658,250 B2
(45) Date of Patent: Jun. 16, 2026

(54) SRAM CELL WITH WRITE ENHANCE PASS GATE TRANSISTORS

(71) Applicant: TAIWAN SEMICONDUCTOR MANUFACTURING COMPANY, LTD., Hsinchu (TW)

(72) Inventors: Wei-Xiang You, Kaohsiung (TW); Wen-Yuan Chen, Taoyuan (TW); Cheng-Yin Wang, Taipei (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 119 days.

(21) Appl. No.: 18/103,939

(22) Filed: Jan. 31, 2023

(65) Prior Publication Data

US 2024/0257867 A1 Aug. 1, 2024

(51) Int. Cl.
| | |
|---|---|
| *G11C 11/419* | (2006.01) |
| *G11C 11/412* | (2006.01) |
| *H10B 10/00* | (2023.01) |
| *H10W 20/41* | (2026.01) |

(52) U.S. Cl.
CPC .......... *G11C 11/419* (2013.01); *G11C 11/412* (2013.01); *H10B 10/125* (2023.02); *H10W 20/435* (2026.01)

(58) Field of Classification Search
CPC .............................. G11C 11/419; G11C 11/41
USPC ......................................................... 365/154
See application file for complete search history.

(56) References Cited

U.S. PATENT DOCUMENTS

| | | | | |
|---|---|---|---|---|
| 5,828,597 A | * | 10/1998 | Madan | G11C 11/412 |
| | | | | 365/174 |
| 6,262,911 B1 | * | 7/2001 | Braceras | G11C 11/412 |
| | | | | 365/156 |
| 7,164,596 B1 | * | 1/2007 | Deng | G11C 11/417 |
| | | | | 365/210.1 |
| 8,625,334 B2 | | 1/2014 | Liaw | |
| 8,879,305 B2 | | 11/2014 | Liaw | |
| 9,419,003 B1 | | 8/2016 | Colinge et al. | |
| 9,613,953 B2 | | 4/2017 | Liaw | |
| 9,793,273 B2 | | 10/2017 | Liaw | |
| 9,805,985 B2 | | 10/2017 | Liaw | |
| 9,991,268 B1 | * | 6/2018 | Liaw | G11C 11/412 |
| 10,170,480 B2 | | 1/2019 | Liaw | |
| 11,024,632 B2 | | 6/2021 | Liaw | |
| 11,170,844 B1 | | 11/2021 | Doluca et al. | |
| 2017/0076782 A1 | * | 3/2017 | Liaw | H01L 27/0922 |

* cited by examiner

*Primary Examiner* — Muna A Techane
(74) *Attorney, Agent, or Firm* — NZ Carr Law Office

(57) ABSTRACT

Embodiments of the present disclosure relate to a SRAM (static random access memory) bit cell. More particularly, embodiments of the present disclosure relate to a single port, 8T SRAM cell with write enhance pass gate transistors. Particularly, two write enhance pass gate transistors are parallelly connected with the pass gate transistors in a standard 6T SRAM cell. The write enhance pass gate transistors are independently controlled from the pass gate transistor using a write enhance word line. In some embodiments, the single port, 8T SRAM cell according to the present disclosure may be implemented by stacked complementary FETs. Empty or dummy PMOS transistors in a standard 6T stacked CFET SRAM cell are used as pass gate transistors or write enhance pass gate transistors.

20 Claims, 7 Drawing Sheets

SRAM CELL WITH WRITE ENHANCE PASS GATE TRANSISTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. Although existing semiconductor devices and methods of fabricating semiconductor devices have been generally adequate for their intended purposes, they have not been entirely satisfactory in all respects. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
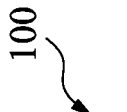
FIG. 1 is a circuit layout of a SRAM bit cell according to embodiments of the present disclosure.
Figure 1:
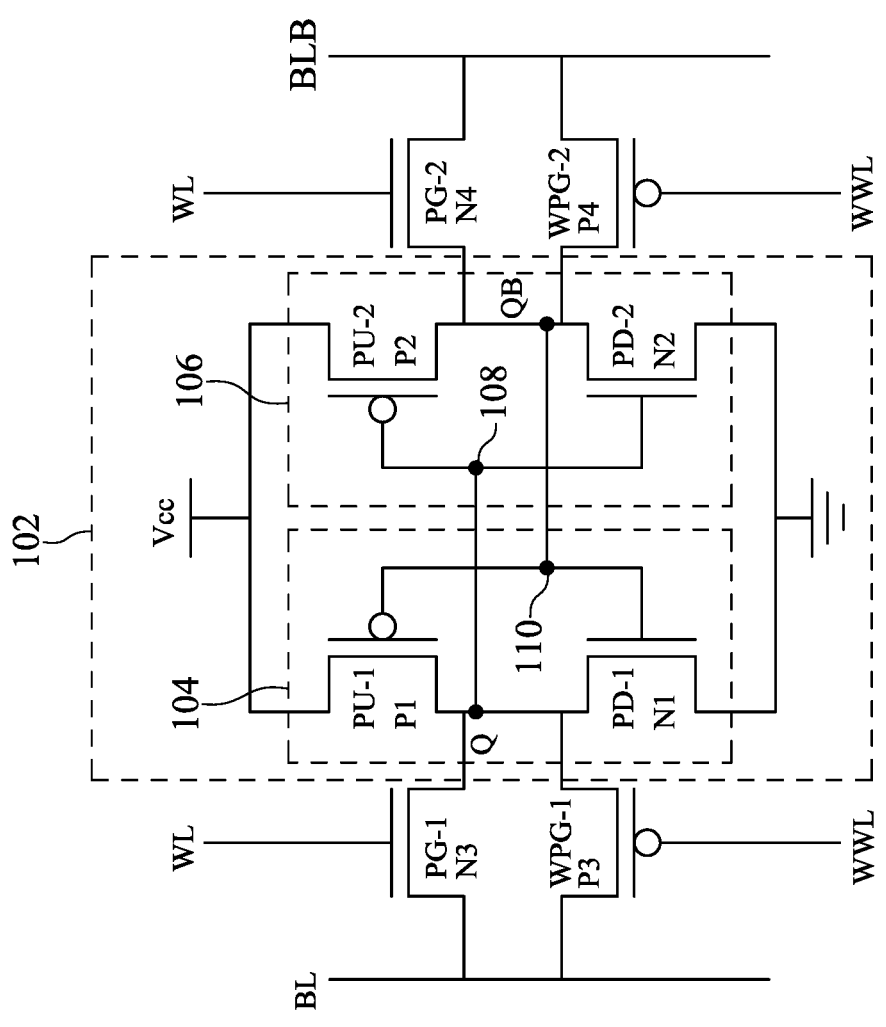

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, GAA (Gate All Around) FETs, such as Horizontal Gate All Around (HGAA) FETs, and Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. Source/drain region(s) may refer to a source or a drain, individually or collectively dependent upon the context.

Embodiments of the present disclosure relate to a SRAM (static random access memory) bit cell. More particularly, embodiments of the present disclosure relate to a single port, 8T SRAM cell with write enhance pass gate transistors. Particularly, two write enhance pass gate transistors are parallelly connected with the pass gate transistors in a standard 6T SRAM cell. The write enhance pass gate transistors are independently controlled from the pass gate transistor using a write enhance word line. In some embodiments, the write enhancement pass gate transistors may be activated during a write operation to enhance write ability and speed. During a read operation, the write enhance pass gate transistors may be inactivated, partially activated, or fully activated according to operation needs.

In some embodiments, the single port, 8T SRAM cell according to the present disclosure may be implemented by stacked complementary FETs. Empty or dummy PMOS transistors in a standard 6T stacked CFET SRAM cell are used as pass gate transistors or write enhance pass gate transistors. The stacked CFET SRAM cell according to the present disclosure offer the flexibility to modulate/optimize the strength of the pass gate transistors during the read/write operations.

FIG. 1 is a SRAM (static random access memory) bit cell circuit layout 100 according to various embodiments of the present disclosure. The SRAM bit cell circuit layout 100 may include field-effect transistors (FETs), such as metal-oxide-semiconductor field effect transistors (MOSFETs). In some embodiments, the SRAM bit cell circuit layout 100 includes fin-like FETs, planar FETs, GAA (Gate All Around) FETs, such as Horizontal Gate All Around (HGAA) FETs, and Vertical Gate All Around (VGAA) FETs, and other suitable devices.

As shown in FIG. 1, the SRAM bit cell circuit layout 100 includes a latch 102 formed by a pair of cross coupled inverters 104, 106. In some embodiments, the inverter 104 includes a PMOS (p-channel metal-oxide semiconductor) transistor P1 and a NMOS (n-channel metal-oxide semiconductor) transistor N1. The PMOS transistor P1 includes a source coupled to a supply voltage Vcc, and a drain coupled to a data storage node Q. The PMOS transistor P1 is commonly referred to as a pull-up transistor and denoted as PU-1. The data storage node Q is connected to a node 108. The node 108 serves as the output of the inverter 104 and the input of the inverter 106. The NMOS transistor N1 of the inverter 104 has a source coupled to the ground Vss, and a drain coupled to the data storage node Q, which connected to the node 108. The NMOS transistor N1 is also referred to as a pull-down transistor PD-1. Gates of the transistors P1 and N1 are coupled together at a node 110. The node 110 serves as the input of the inverter 104 and the output of the inverter 106. The inverter 106 includes a PMOS transistor P2 and a NMOS transistor N2. The PMOS transistor P2 has a source coupled to the supply voltage Vcc, a gate coupled to the node 108, and a drain coupled to a data bar storage node QB. The PMOS transistor P2 is commonly referred to as a pull-up transistor and denoted as PU-2. The data bar storage node QB is connected to the node 110. The NMOS transistor N2 has a source coupled to the ground Vss at the node 138, a drain coupled to the data bar storage node QB, which connected to the node 110, and a gate coupled to the node 108. The NMOS transistor N2 is also referred to as a pull-down transistor PD-2.

The SRAM bit cell circuit layout 100 further includes two pairs of pass gate transistors PG1, WPG-1 and PG-2, WPG-2. In some embodiments, sources of the pass gate transistors PG1, WPG-1 are coupled to the data storage node Q and drains of the pass gate transistors PG-1, WPG-1 are coupled to a bit line conductor BL. The pair of pass gate transistors PG-1, WPG-1 may be independently activated by two different word lines. For example, a gate of the transistor PG-1 is connected to a word line WL, and a gate of the pass gate transistor WPG-1 is connected to a write enhancing word line WWL. The word line WL and the write enhancing word line WWL are independently controlled to activate and inactivate the pass gate transistors PG-1, WPG-1 during reading and writing operations. Similarly, sources of the pass gate transistors PG-2, WPG-2 are coupled to the data bar storage node QB and drains of the pass gate transistors PG-2, WPG-2 are coupled to a bit line bar conductor BLB. The pair of pass gate transistors PG-2, WPG-2 may be independently activated by two different word lines. For example, a gate of the transistor PG-32 is connected to the word line WL, and a gate of the pass gate transistor WPG-2 is connected to the write enhancing word line WWL. The word line WL and the write enhancing word line WWL are independently controlled to activate and inactivate the pass gate transistors PG-2, WPG-2 during reading and writing operations. In some embodiments, the pass gate transistors PG-1 and PG-2 are NMOS transistors N3, N4. The pass gate transistors WPG-1, WPG-2 are PMOS transistors P3, P4.

During operation, the word line WL and write enhancing word line WL may be used alone or in combination to activate the pass gate transistors PG-1, PG-2, WPG-1, WPG-2. For example, all four the pass gate transistors PG-1, PG-2, WPG-1, WPG-2 are activated to enhance write ability and speed during write operation. Only two pass gate transistors PG-1, PG-2 are activated during read operation to achieve read speed. In some embodiments, in read operation, the pass gate transistors PG-1, PG-2 are fully activated while the pass gate transistors are partially or fully activated.

During a write operation, incoming data and complementary data are transferred to the bit line BL and bit line bar BLB respectively. If the SRAM bit cell circuit layout 100 is unselected, the word line WL is set to 0 to inactivate the pass gate transistors PG-1, PG-2 and the write enhance word line WWL is set to Vdd or "1" to inactivate the pass gate transistors WPG-1, WPG-2. If the SRAM bit cell circuit layout 100 is selected, the word line WL is set to Vdd or "1" to activate the pass gate transistors PG-1, PG-2 and the write enhance word line WWL is set to zero to activate pass gate transistors WPG-1, WPG-2. The pairs of pass gate transistors PG-1/WPG-1 and PG-2/WPG-2 activated, a strong transmission gate type pass gate is created, the bit line BL and the bit line bar BLB can quickly flip the state of the SRAM bit cell in the circuit layout 100, reduce the threshold voltage to write $V_{write, 0}$, enhancing the write ability and speed.

When writing "1" to the SRAM bit cell circuit layout 100 previously stored "0", the bit line BL is charged to "1" the bit line bar BLB is set to "0", the word line WL is set to Vdd or "1" to activate the pass gate transistors PG-1, PG-2, and the write enhance word line WWL is set to zero to activate pass gate transistors WPG-1, WPG-2. Initially, "0" is stored in the data storage node Q and "1" is stored in the data bar storage node QB. The "0" voltage in the data storage node Q keeps the pull up transistor PU-2 or P2 activated and the pull down transistor PD-2 or N2 inactivated. The "1" voltage in the data storage bar node QB keeps the pull up transistor PU-1 or P1 inactivated and the pull down transistor PD-1 or N1 activated. When the pass gate transistors PG-1 and WPG-1 are activated by signals from the word line WL and write enhance word line WWL, the data storage node Q is charged by current flows from the bit line BL through both the pass gate transistors PG-1 and WPG-1. As the data storage node Q is charged toward "1", the pull up transistor PU-2 or P2 is inactivated and the pull down transistor PD-2 or N2 is activated. As the pull down transistor PD-2 or N2 is activated, the data storage bar node QB is discharged to "0", which in turn inactivates the pull down transistor PD-1 or N1, and locks the charge in the data storage node Q. Thus, the write operation is complete with "1" is stored in the data storage node Q and the "0" is stored in the data bar storage node QB.

When writing "0" to the SRAM bit cell circuit layout 100 previously stored "1", the bit line BL is set to "0" the bit line bar BLB is charged to "1", the word line WL is set to Vdd or "1" to activate the pass gate transistors PG-1, PG-2, and the write enhance word line WWL is set to zero to activate pass gate transistors WPG-1, WPG-2. Initially, "0" is stored in the data storage node QB and "1" is stored in the data storage node Q. The "0" voltage in the data storage node QB keeps the pull up transistor PU-1 or P1 activated and the pull down transistor PD-1 or N1 inactivated. The "1" voltage in the data storage bar node Q keeps the pull up transistor PU-2 or P2 inactivated and the pull down transistor PD-2 or N2 activated. When the pass gate transistors PG-2 and WPG-2 are activated by signals from the word line WL and write enhance word line WWL, the data storage node QB is charged by current flows from the bit line BL through both the pass gate transistors PG-2 and WPG-2. As the data storage node QB is charged toward "1", the pull up transistor PU-1 or P1 is inactivated and the pull down transistor PD-1 or N1 is activated. As the pull down transistor PD-1 or N1 is activated, the data storage bar node Q is discharged to "0", which in turn inactivates the pull down transistor PD-2 or N2, and locks the charge in the data storage node QB. Thus, the write operation is complete with "0" is stored in the data storage node Q and the "1" is stored in the data bar storage node QB.

During a read operation, the bit line BL and bit line bar BLB are set to "1" or pre-charged to Vdd. If the SRAM bit cell in the circuit layout 100 is selected, the word line WL is set to Vdd or "1" to activate the pass gate transistors PG-1, PG-2, and the write enhance word line WWL is set to Vdd or "1" to inactivate the pass gate transistors WPG-1, WPG-2. If the SRAM bit cell in the circuit layout 100 is unselected, the word line WL is set to ground or "0" to inactivate the pass gate transistors PG-1, PG-2, and the write enhance word line WWL is set to Vdd or "1" to inactivate the pass gate transistors WPG-1, WPG-2. That is to say that the pass gate transistors WPG-1, WPG-2 are inactive during read operation. In some embodiments, the pass gate transistors WPG-1, WPG-2 may be partially or fully activated to compensate the read speed degradation caused by extra bit line BL and bit line bar BLB capacitances. The pass gate transistors WPG-1, WPG-2 may be partially or fully activated by setting the write enhance word line WWL between a 0V and Vdd.

If "0" is stored in the data storage node Q, then "1" is stored in the data bar storage node QB. The data storage node Q is connected to the gate of the pull down transistor PD-2 or N2 and the gate of the pull up transistor PU-2 or P2. The "0" voltage in the data storage node Q keeps the pull up transistor PU-2 or P2 activated and the pull down transistor PD-2 or N2 inactivated. The "1" voltage in the data storage bar node QB keeps the pull up transistor PU-1 or P1 inactivated and the pull down transistor PD-1 or N1 activated. As the pass gate transistor PG-1 opens under the "1" signal from the word line WL, the bit line BL is discharged through the pass gate transistor PG-1 or N3 and the pull down transistor PD-1 or N1 to the ground. Even though the pass gate transistor PG-2 is activated by the "1" value in the bit line bar BLB, the bit line bar BLB can't be discharged because there is no flow goes through the pull down transistor PD-2 or N2. Thus, the bit line BL is discharged to "0" and the bit line bar BLB remains "1", and the SRAM bit cell circuit layout 100 reads "0".

If "1" is stored in the data storage node Q, then "0" is stored in the data bar storage node QB. The data storage node Q is connected to the gate of the pull down transistor PD-2 or N2 and the gate of the pull up transistor PU-2 or P2. The "1" voltage in the data storage node Q keeps the pull up transistor PU-2 or P2 inactivated and the pull down transistor PD-2 or N2 activated. The "0" voltage in the data storage bar node QB keeps the pull up transistor PU-1 or P1 activated and the pull down transistor PD-1 or N1 inactivated. As the pass gate transistor PG-2 opens under the "1" signal from the word line WL, the bit line bar BLB is discharged through the pass gate transistor PG-2 or N4 and the pull down transistor PD-2 or N2 to the ground. Even though the pass gate transistor PG-1 is activated by the "1" value in the bit line BL, the bit line BL can't be discharged because there is no flow goes through the pull down transistor PD-1 or N1. Thus, the bit line bar BLB is discharged to "0" and the bit line BL remains "1", and the SRAM bit cell circuit layout 100 reads "1".

Figures 2A, 2B:
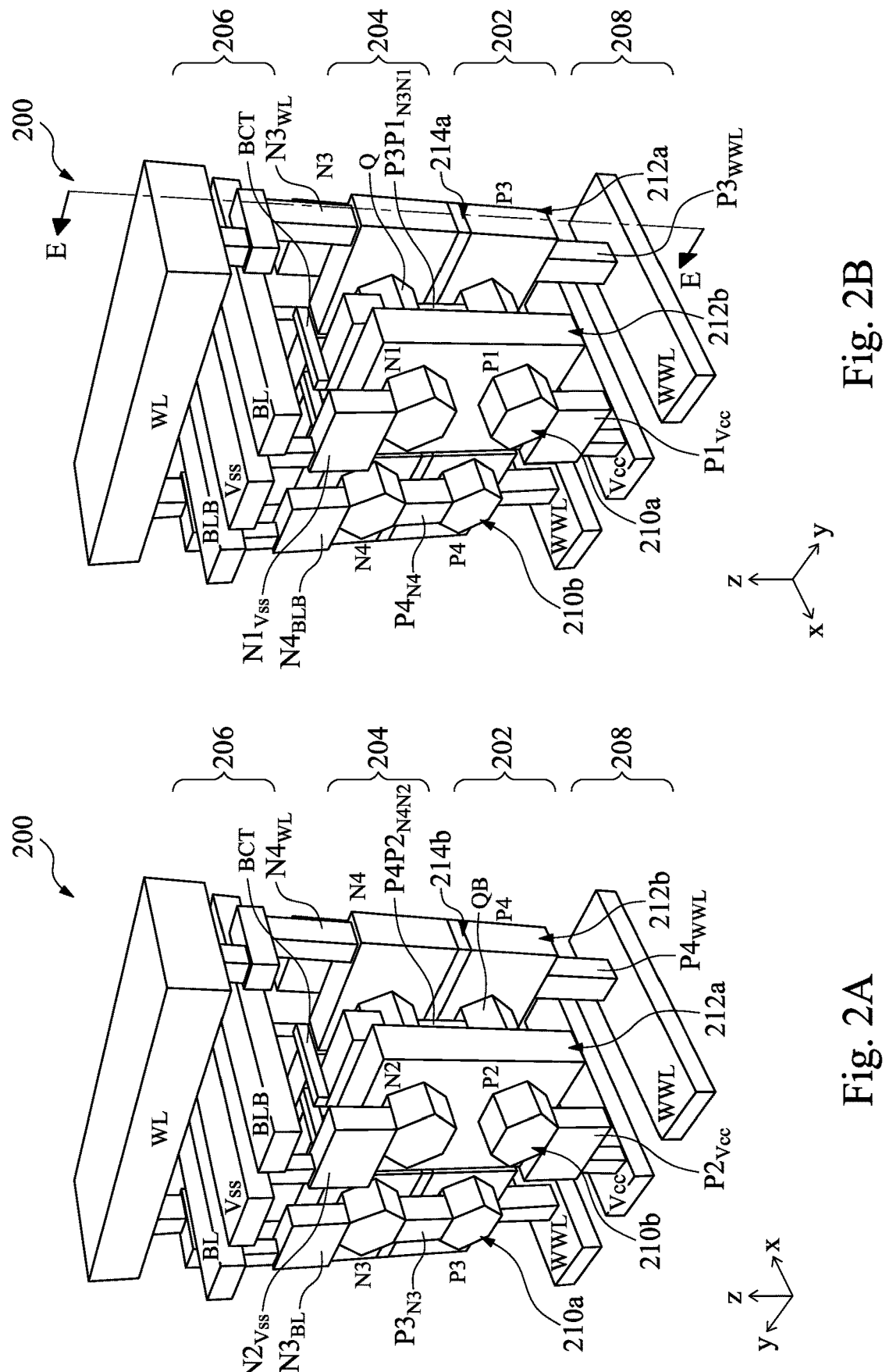
FIGS. 2A and 2B are schematic perspective views of a SRAM bit cell having the circuit layout of FIG. 1 and implemented with stacked complementary field effect transistors (CFETs) according to embodiments of the present disclosure.

As discussed, the SRAM bit cell circuit layout 100 may be implemented by various designs using different FETs. In some embodiments, the SRAM bit cell circuit layout 100 may be implemented by stacked field effect transistors (CFETs). Because the SRAM bit cell circuit layout 100 includes four NMOS transistors and four PMOS transistors, NMOS transistors and PMOS transistors may be vertically stacked without increasing foot print. FIGS. 2A and 2B are schematic perspective views of a SRAM bit cell 200 including stacked CFETs according to embodiments of the present disclosure. The SRAM bit cell 200 has a circuit layout 100 as shown in FIG. 1. For clarity, the SRAM bit cell 200 are shown in FIGS. 2A and 2B with dielectric layers, such as interlayer dielectric, sidewall spacers, inner spacers, and etch stop layers, omitted.

In some embodiments, the SRAM bit cell 200 includes vertically stacked GAA FETs. The SRAM bit cell 200 may include a first transistor level 202 and a second transistor level 204 formed above the first transistor level 202. The first transistor level 202 and the second transistor level 204 have the same fin structure layout and the same gate structure layout, but include different types of devices. For example, the first transistor level 202 includes p-type transistors and the second transistor level 204 include n-type transistors. The SRAM bit cell 200 includes a front side interconnect structure 206 disposed above the second transistor level 204. In some embodiments, the SRAM bit cell 200 further includes a back side interconnect structure 208 disposed below the second transistor level 204.

The SPRAM bit cell 200 may be fabricated by forming two fin structures 210a, 210b on a substrate. Each of the two fin structures 210a, 210b includes one or more p-type semiconductor channels 216p and one or more n-type semiconductor channels 216n. The p-type semiconductor channels 216p and the n-type semiconductor channels 216n are vertically stacked and with sacrificial layers formed between the layers. Gate structures 212a, 212b are then formed over the two fin structures 210a, 210b. The fin structures 210a, 210b not covered by the gate structures 212a, 212b are then etched back. Source/drain features for the first transistor level 202 are then formed between the gate structures 212a, 212b and in contact with the p-type semiconductor channels 216p. A contact etch stop layer and an interlayer dielectric layer may then be deposited over the source/drain features of the first transistor level 202. Source/drain features for the second transistor level 204 are formed between the gate structures 212a, 212b, in contact with the n-type semiconductor channels 216n. A contact etch stop layer (CESL) and an interlayer dielectric layer may then be deposited over the source/drain features of the second transistor level 204. In some embodiments, a replacement sequence is performed to form gate structures. In some embodiments, a gate dielectric layer and a gate electrode layer may be formed around the semiconductor channels 216p, 216n. In some embodiments, insulators, such as insulator 214*a*, 214*b* may be formed between gate electrode layers.

Figures 2C, 2D, 2E:
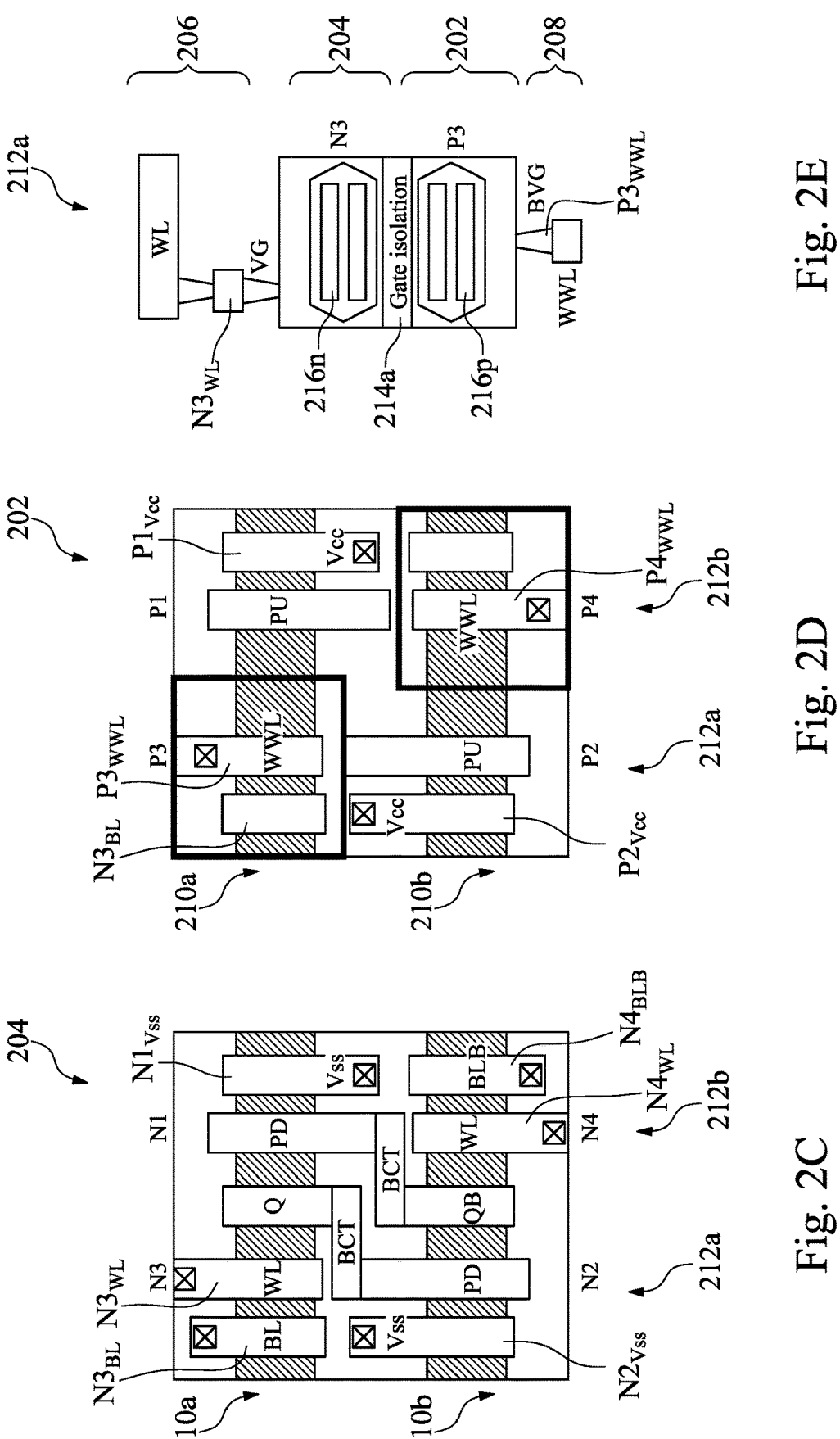
FIG. 2C is a schematic transistor layout of the SRAM bit cell of in FIG. 2A at a top level.
FIG. 2D is a schematic transistor layout of the SRAM bit cell of in FIG. 2A at a bottom level.
FIG. 2E is a schematic cross-sectional view of the SRAM bit cell of FIG. 2A.

After formation of the gate structures, eight transistors are formed in two stacked layers. FIG. 2C is a schematic transistor layout of the SRAM bit cell 200 of the top transistor level or the transistor level 204. FIG. 2D is a schematic transistor layout of the SRAM bit cell 200 at the bottom level or the transistor level 202. FIG. 2E is a schematic cross-sectional view of the SRAM bit cell 200 showing the gate structure 212*a*.

As shown in FIG. 2D, four PMOS transistors P1, P2, P3, P4 are formed in the first transistor level 202. The transistors P1 and P2 in the first transistor level 202 function as the pull up transistors PU-1, PU-2 in the SRAM bit cell circuit layout 100 of FIG. 1. In some embodiments, the transistors P1 and P2 are positioned in diagonally across from each other. The transistors P1, P3 share one common source/drain feature. A source/drain contact feature P3P1$_{N3N1}$, shown in FIG. 2B, is formed on the common source/drain feature to subsequently form the data storage node Q. Transistors P2, P4 share one common source/drain feature. A source/drain contact feature P4P2$_{N4N2}$, shown in FIG. 2A, is formed on the common source/drain feature to subsequently form the data bar storage node QB. The transistor P3, P4 function as pass gate transistors WPG-1, WPG-2 in the SRAM bit cell circuit layout 100 of FIG. 1. A source/drain contact feature P3$_{N3}$, shown in FIG. 2A, is formed on the other source/drain feature of the transistor P3 to subsequently with the bit line BL. A source/drain contact feature P4$_{N4}$, shown in FIG. 2B, is formed on the other source/drain feature of the transistor P4 to subsequently with the bit line bar BLB.

As shown in FIG. 2C, four NMOS transistors N1, N2, N3, N4 are formed in the second transistor level 204. The NMOS transistors N1, N2, N3, N4 are stacked over the PMOS transistors P1, P2, P3, P4 respectively. The transistors N1 and N2 in the second transistor level 204 function as the pull down transistors PD-1, PD-2 in the SRAM bit cell circuit layout 100 of FIG. 1. The transistors N1 and N2 are positioned in diagonally across from each other. The transistor N3, N4 function as pass gate transistors PG-1, PG-2 in the SRAM bit cell circuit layout 100 of FIG. 1. The transistors N1, N3 share one common source/drain feature, which is in contact with the source/drain contact feature P3P1$_{N3N1}$, shown in FIG. 2B, forming the data storage node Q. The transistors N2, N4 share one common source/drain feature, which is in contact with the source/drain contact feature P4P2$_{N4N2}$, shown in FIG. 2A, forming the data bar storage node QB.

Source/drain contact features and gate contact features are then formed in and on the second transistor level 204. For example, source/drain contact features N1Vss, N2Vss, N3BL, N4BLB, N3WL, N4WL are formed on the corresponding source/drain features in the transistors N1, N2, N3, N4. The source/drain contact features N1Vss, N2Vss, N3BL, N4BLB, are in contact with the source/drain features of the transistors N1, N2, N3, N4 respectively and subsequently connected to the ground power mesh Vss, the bit line BL, and the bit line bar BLB in the front side interconnect structure 206. The conductive features N3WL, N4WL are in contact with the gate electrodes of the transistors N3, N4 respectively and subsequently connected to the word line WL form in the front side interconnect structure 206.

In the stacked gate structures 212*a*, 212*b*, the gate electrodes of the pull down transistor PD-1/N1 and the pull up transistor PU-1/P1 are connected, the gate electrodes of the pull down transistor PD-2/N2 and the pull up transistor PU-2/P2 are connected, the gate electrodes of the pass gate transistor PG-1/N3 and the pass gate transistor WPG-1/P3 are isolated by the insulator 214*a*, and the gate electrodes of the pass gate transistor PG-2/N4 and the pass gate transistor WPG-2/P4 are isolated by the insulator 214*b*, as shown in FIGS. 2A and 2B. In some embodiment, BCTs (butt connection terminals) are formed in the second transistor level 204 to connect the source/drain features in the data storage node Q to the gate electrode of the pull down transistor PD-2/N2, and between the source/drain features in the data storage node QB to the gate electrode of the pull down transistor PD-1/N1.

The front side interconnect structure 206 is then formed on the second transistor level 204 to provide power and signal to the transistors. In some embodiments, the front side interconnect structure 206 includes bit line BL, bit line bar BLB, ground voltage line Vss, and a first word line WL. In some embodiments, the bit line BL, bit line bar BLB, and the ground line Vss are formed in a first metal layer, and extend along the same direction as the fin structures 210*a*, 210*b*. In some embodiments, the ground line Vss may be positioned between the bit line BL and the bit line bar BLB. The first word line WL may be disposed in a second metal layer, and extends along the same direction as the gate structures 212*a*, 212*b*. In some embodiments, the second metal layer is above the first metal layer.

Additional metal layers, not shown, are formed in the front side interconnect structure 206 to connect the SRAM bit cell 200 to external circuits. After formation of the front side interconnect structure 206, the substrate on which the SRAM bit cell 200 is fabricated is flipped over and grinded down to expose the source/drain features of the first transistor level 202.

Source/drain contact features and gate contact features are then formed in and on the first transistor level 202 from the back side. For example, source/drain contact features P1Vcc, P2Vcc are formed on the corresponding source/drain features in the transistors P1, P2. The source/drain contact features P1Vcc, P2Vcc, are in contact with the source/drain features of the transistors P1, P2 respectively and subsequently connected to a voltage supply line Vcc in the back side interconnect structure 208. The conductive features N3WL, N4WL are in contact with the gate electrodes of the transistors N3, N4 respectively and subsequently connected to a second word line WWL form in the front side interconnect structure 206.

The back side interconnect structure 208 is then formed on the back side to provide power and signal to the transistors. In some embodiments, the back side interconnect structure 208 includes a voltage supply line Vcc, and two second word lines WWL. In some embodiments, the voltage supply line Vcc and the two second word lines WWL are formed in the same metal layer and extend along the same direction as the fin structures 210*a*, 210*b*. In some embodiments, the voltage supply line Vcc may be positioned between the two second word lines WWL.

It should be noted that the bit line, bit line bar, the word line, the write enhance word line, and the power grill, such as the voltage supply line Vcc and ground line Vss, may be arranged in other manners. The transistors may also be arranged in other manner. Various examples are discussed below.

Figure 3C:
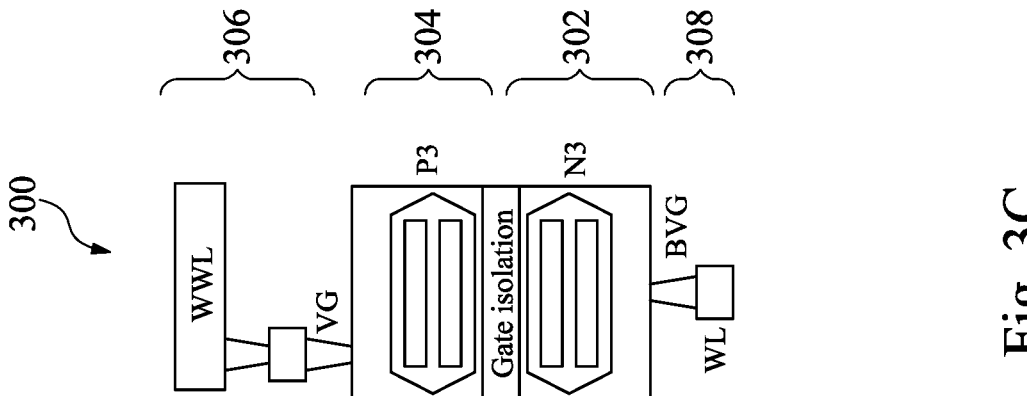
FIG. 3C is a schematic cross-sectional view of the SRAM bit cell of FIG. 3A.
Figure 3B:
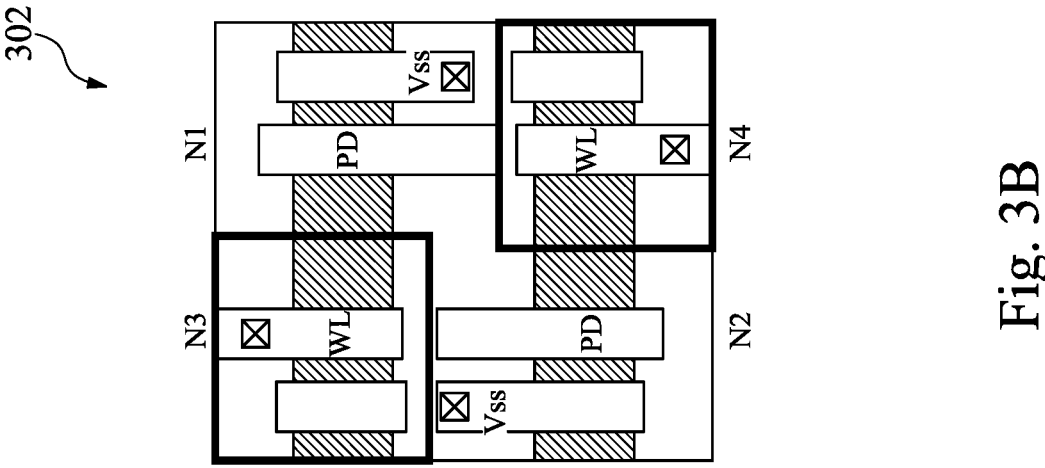
FIG. 3B is a schematic a bottom level transistor layout of the SRAM bit cell of FIG. 3A.
Figure 3A:
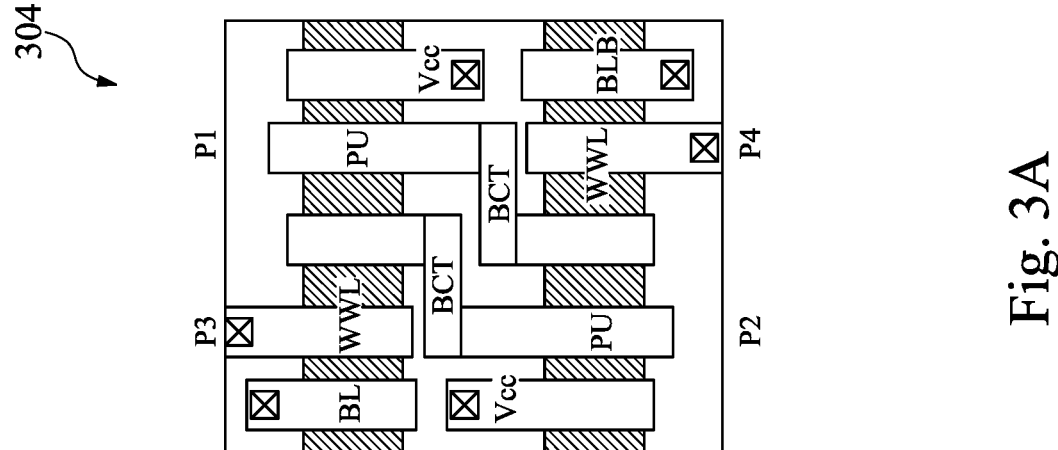
FIG. 3A is a schematic a top level transistor layout of a SRAM bit cell with circuit layout of FIG. 1 implemented with stacked CFETs.

FIG. 3A is a schematic a top level transistor layout of a SRAM bit cell 300 with the circuit layout 100 of FIG. 1 and implemented with stacked CFETs. FIG. 3B is a schematic a bottom level transistor layout of the SRAM bit cell 300 of FIG. 3A. FIG. 3C is a schematic cross-sectional view of the SRAM bit cell of FIG. 3A. The SRAM bit cell 300 is similar to the SRAM bit cell 200 except that the word line WL p-type transistors are stacked above n-type transistors in the SRAM bit cell 300.

The SRAM bit cell 300 includes a first transistor level 302 and a second transistor level 304 formed above the first transistor level 302. The first transistor level 302 includes n-type transistors and the second transistor level 304 include p-type transistors. The SRAM bit cell 300 includes a front side interconnect structure 306 disposed above the second transistor level 304. In some embodiments, the SRAM bit cell 300 further includes a back side interconnect structure 308 disposed below the second transistor level 304.

As shown in FIG. 3B, four NMOS transistors N1, N2, N3, N4 are formed in the first transistor level 302. The transistors N1 and N2 in the first transistor level 304 function as the pull down transistors PD-1, PD-2 in the SRAM bit cell circuit layout 100 of FIG. 1. The transistors N1 and N2 are positioned in diagonally across from each other. The transistor N3, N4 function as pass gate transistors PG-1, PG-2 in the SRAM bit cell circuit layout 100 of FIG. 1. The transistors N1, N3 share one common source/drain feature, which subsequently becomes a part of the data storage node Q. The transistors N2, N4 share one common source/drain feature, which subsequently becomes a part of the data bar storage node QB.

As shown in FIG. 3A, four PMOS transistors P1, P2, P3, P4 are formed in the second transistor level 304. The transistors P1 and P2 in the second transistor level 204 function as the pull up transistors PU-1, PU-2 in the SRAM bit cell circuit layout 100 of FIG. 1. In some embodiments, the transistors P1 and P2 are positioned in diagonally across from each other. The transistors P1, P3 share one common source/drain feature. The PMOS transistors P1, P2, P3, P4 are stacked over NMOS transistors N1, N2, N3, N4 the respectively. The transistors P1, P3 share a common source/drain feature, which subsequently becomes a part of the data storage node Q. Transistors P2, P4 share one common source/drain feature which subsequently becomes a part of the data bar storage node QB. The transistor P3, P4 function as pass gate transistors WPG-1, WPG-2 in the SRAM bit cell circuit layout 100 of FIG. 1. The BCTs are formed in the second transistor level 304. In some embodiment, BCTs (butt connection terminals) between the source/drain features in the data storage node Q to the gate electrode of the pull up transistor PU-2/P2, and between the source/drain features in the data bar storage node QB to the gate electrode of the pull up transistor PU-1/P1.

The front side interconnect structure 306 is formed on the second transistor level 304 to provide power and signal to the transistors. In some embodiments, the front side interconnect structure 306 includes bit line BL, bit line bar BLB, a voltage supply line Vcc, and a write enhance word line VWWL. In some embodiments, the bit line BL, bit line bar BLB, and the voltage supply line Vcc are formed in a first metal layer, and extend along the same direction as the fin structures. In some embodiments, the voltage supply line Vcc may be positioned between the bit line BL and the bit line bar BLB. The write enhance word line WWL may be disposed in a second metal layer, and extends along the same direction as the gate structures. In some embodiments, the second metal layer is above the first metal layer.

The back side interconnect structure 308 is formed on the back side to provide power and signal to the transistors. In some embodiments, the back side interconnect structure 308 includes a ground line Vss, and two word lines WL. In some embodiments, the ground line Vss and the two word lines WL are formed in the same metal layer and extend along the same direction as the fin structures. In some embodiments, the ground line Vss may be positioned between the two second word lines WL.

Figure 4:
FIG. 4 is a circuit layout of a SRAM bit cell according to embodiments of the present disclosure.
Figure 4:
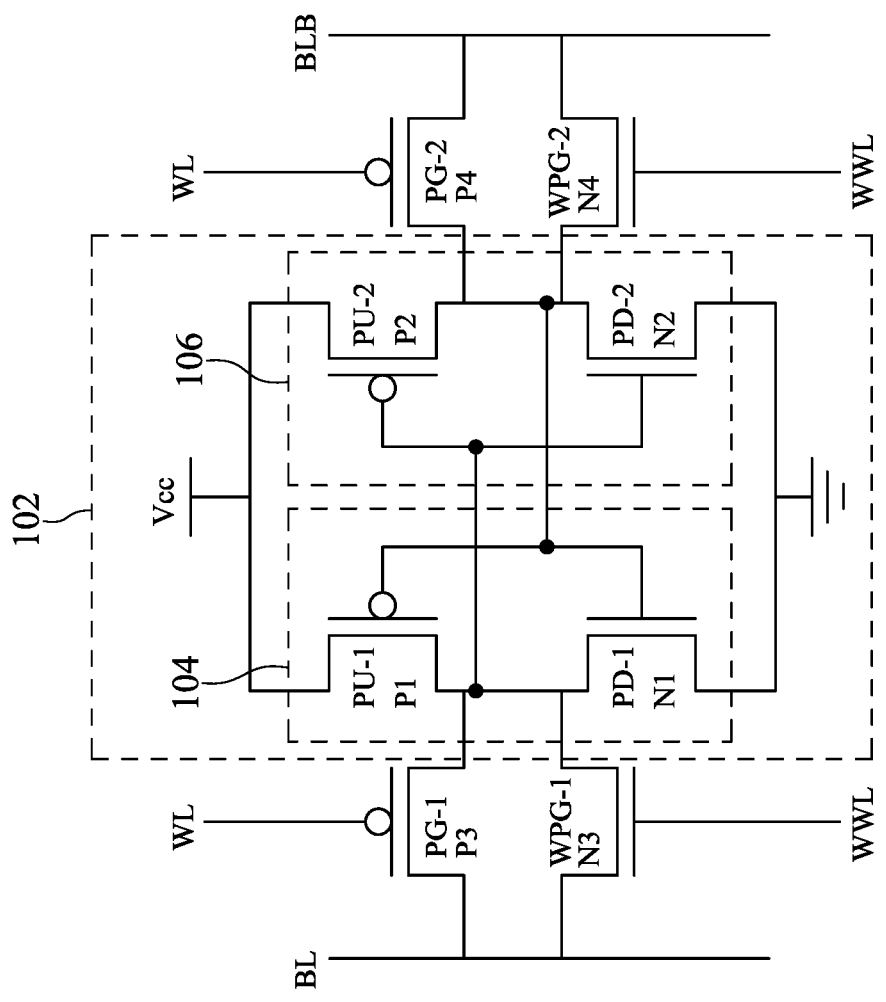

FIG. 4 is a circuit layout 400 of a SRAM bit cell according to embodiments of the present disclosure. The circuit layout 400 is similar to the circuit layout 100 except that the word line WL are connected to the p-type transistors P3, P4 and the write enhance transistor WWL are connected to the n-type transistors N3, N4. Thus, the p-type transistors P3, P4 function as the pass gate transistors PG-1, PG-2, which are activated during both read and write operations, and the n-type transistors N3, N4 function as the write enhance pass gate transistors WPG-1, WPG-2, which are activated during the write operation, but may be inactivated or partially activated during a read operation.

During a write operation, incoming data and complementary data are transferred to the bit line BL and bit line bar BLB respectively. If the SRAM bit cell circuit layout 400 is unselected, the word line WL is set to Vdd or "1" to inactivate the pass gate transistors PG-1/P3, PG-2/P4 and the write enhance word line VWWL is set to ground or "0" to inactivate the pass gate transistors WPG-1/N3, WPG-2/N4. If the SRAM bit cell circuit layout 400 is selected, the word line WL is set to ground or "0" to activate the pass gate transistors PG-1, PG-2 and the write enhance word line WWL is pre-charged to Vdd or "1" to activate the pass gate transistors WPG-1, WPG-2. The pairs of pass gate transistors PG-1/WPG-1 and PG-2/WPG-2 activated, a strong transmission gate type pass gate is created, the bit line BL and the bit line bar BLB can quickly flip the state of the SRAM bit cell in the circuit layout 400, reduce the threshold voltage to write $V_{write, 0}$, enhancing the write ability and speed.

During a read operation, the bit line BL and bit line bar BLB are set to "0" or set to Vss. If the SRAM bit cell in the circuit layout 400 is selected, the word line WL is set to ground or "0" to activate the pass gate transistors PG-1/P3, PG-2/P4, and the write enhance word line WWL is set to Vss or "0" to inactivate the pass gate transistors WPG-1/N3, WPG-2/N4. If the SRAM bit cell in the circuit layout 400 is unselected, the word line WL is set to ground or "0" to inactivate the pass gate transistors PG-1, PG-2, and the write enhance word line WWL is pre-charged to Vdd or "1" to inactivate the pass gate transistors WPG-1, WPG-2. That is to say that the pass gate transistors WPG-1, WPG-2 are inactive during read operation. In some embodiments, the pass gate transistors WPG-1, WPG-2 may be partially or fully activated to compensate the read speed degradation caused by extra bit line BL and bit line bar BLB capacitances. The pass gate transistors WPG-1, WPG-2 may be partially or fully activated by setting the write enhance word line WWL between a 0V and Vdd.

Figure 5C:
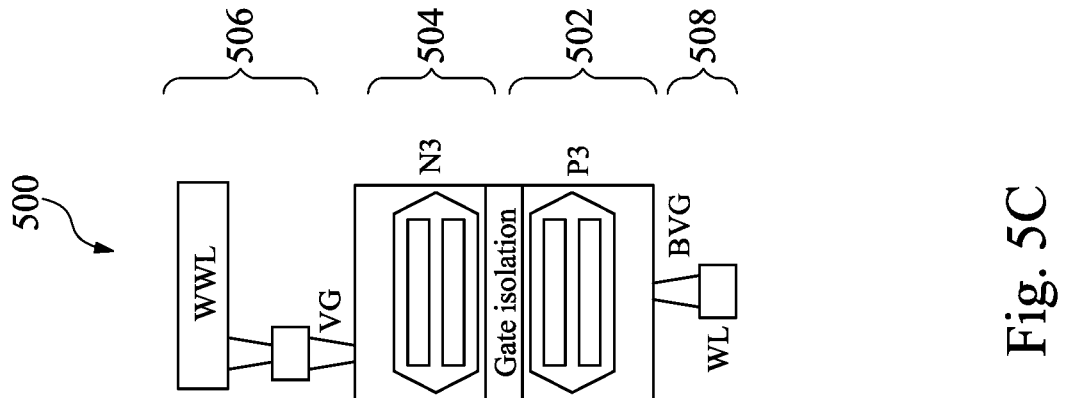
FIG. 5C is a schematic cross-sectional view of the SRAM bit cell of FIG. 5A.
Figure 5B:
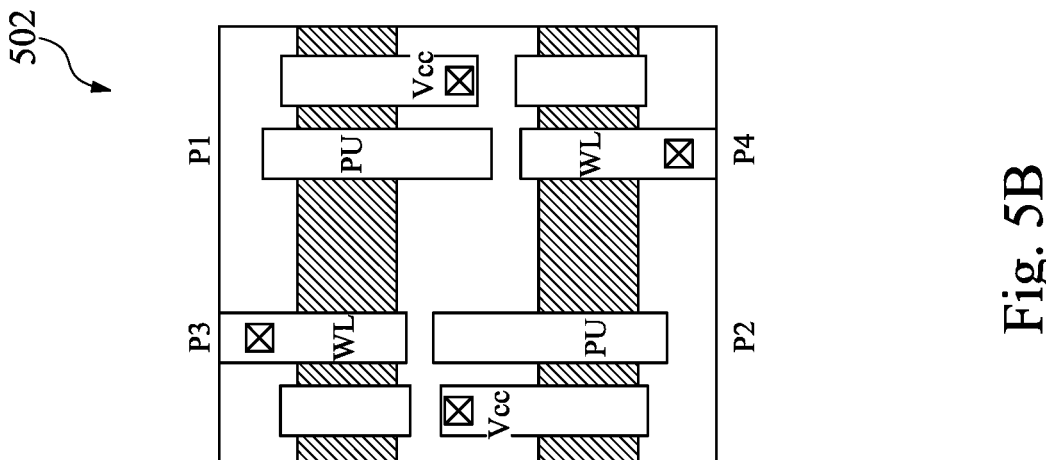
FIG. 5B is a schematic a bottom level transistor layout of the SRAM bit cell of FIG. 5A.
Figure 5A:
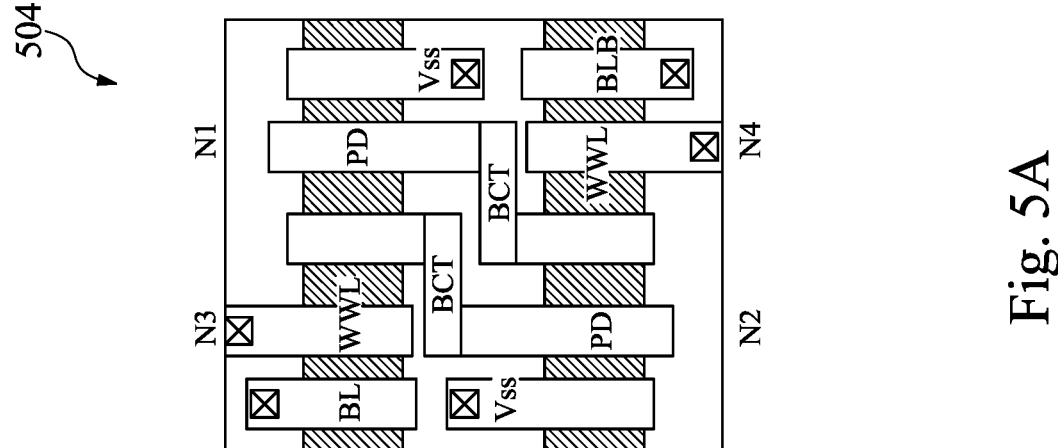
FIG. 5A is a schematic a top level transistor layout of a SRAM bit cell with the circuit layout of FIG. 4 and implemented with stacked CFETs.

FIG. 5A is a schematic a top level transistor layout of a SRAM bit cell 500 with the circuit layout 400 of FIG. 4 and implemented with stacked CFETs. FIG. 5B is a schematic a bottom level transistor layout of the SRAM bit cell 500 of FIG. 5A. FIG. 5C is a schematic cross-sectional view of the SRAM bit cell 500 of FIG. 5A. The SRAM bit cell 500 is similar to the SRAM bit cell 200 except that the word line WL is formed on the back side and the write enhance word line WWL is formed on the front side.

The SRAM bit cell 500 includes a first transistor level 502 and a second transistor level 504 formed above the first transistor level 502. The first transistor level 502 includes p-type transistors and the second transistor level 504 include n-type transistors. The SRAM bit cell 500 includes a front side interconnect structure 506 disposed above the second transistor level 504. In some embodiments, the SRAM bit cell 500 further includes a back side interconnect structure 508 disposed below the second transistor level 504.

As shown in FIG. 5B, four PMOS transistors P1, P2, P3, P4 are formed in the first transistor level 502. The transistors P1 and P2 in the first transistor level 504 function as the pull up transistors PU-1, PU-2 in the SRAM bit cell circuit layout 400 of FIG. 4. The transistors P1 and N2 are positioned in diagonally across from each other. The transistor P3, P4 function as the pass gate transistors PG-1, PG-2 in the SRAM bit cell circuit layout 400 of FIG. 4. The transistors P1, P3 share one common source/drain feature, which subsequently becomes a part of the data storage node Q. The transistors P2, P4 share one common source/drain feature, which subsequently becomes a part of the data bar storage node QB.

As shown in FIG. 5A, four NMOS transistors N1, N2, N3, N4 are formed in the second transistor level 504. The transistors N1 and N2 in the second transistor level 504 function as the pull down transistors PD-1, PD-2 in the SRAM bit cell circuit layout 400 of FIG. 4. In some embodiments, the transistors N1 and N2 are positioned in diagonally across from each other. The transistors N1, N3 share one common source/drain feature. The NMOS transistors N1, N2, N3, N4 are stacked over PMOS transistors P1, P2, P3, P4 the respectively. The transistors N1, N3 share a common source/drain feature, which subsequently becomes a part of the data storage node Q. Transistors N2, N4 share one common source/drain feature which subsequently becomes a part of the data bar storage node QB. The transistor N3, N4 function as the write enhance pass gate transistors WPG-1, WPG-2 in the SRAM bit cell circuit layout 400 of FIG. 4. The BCTs are formed in the second transistor level 504. In some embodiment, BCTs (butt connection terminals) between the source/drain features in the data storage node Q to the gate electrode of the pull up transistor PD-2/N2, and between the source/drain features in the data bar storage node QB to the gate electrode of the pull up transistor PD-1/N1.

The front side interconnect structure 506 is formed on the second transistor level 504 to provide power and signal to the transistors. In some embodiments, the front side interconnect structure 506 includes bit line BL, bit line bar BLB, a ground line Vss, and a write enhance word line WWL. In some embodiments, the bit line BL, bit line bar BLB, and the ground line Vss are formed in a first metal layer, and extend along the same direction as the fin structures. In some embodiments, the ground line Vss may be positioned between the bit line BL and the bit line bar BLB. The write enhance word line WWL may be disposed in a second metal layer, and extends along the same direction as the gate structures. In some embodiments, the second metal layer is above the first metal layer.

The back side interconnect structure 508 is formed on the back side to provide power and signal to the transistors. In some embodiments, the back side interconnect structure 508 includes a power supply line Vcc, and two word lines WL. In some embodiments, the ground line Vss and the two word lines WL are formed in the same metal layer and extend along the same direction as the fin structures. In some embodiments, the power supply line Vcc may be positioned between the two second word lines WL.

Figure 6C:
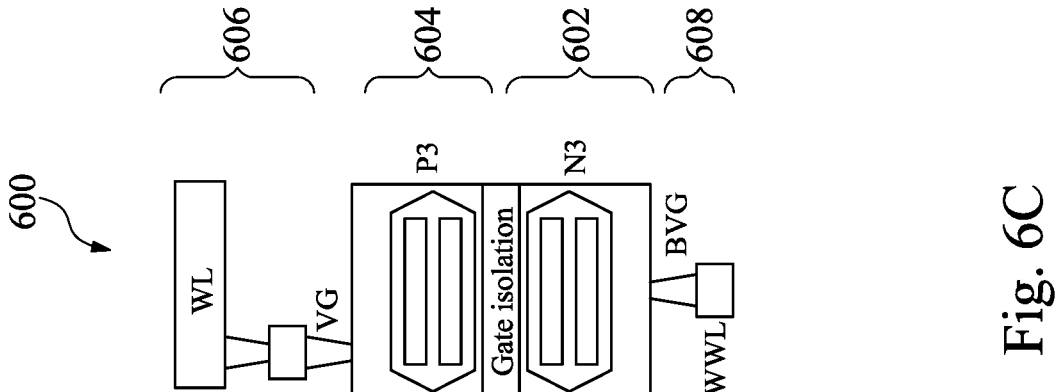
FIG. 6C is a schematic cross-sectional view of the SRAM bit cell of FIG. 6A.
Figure 6B:
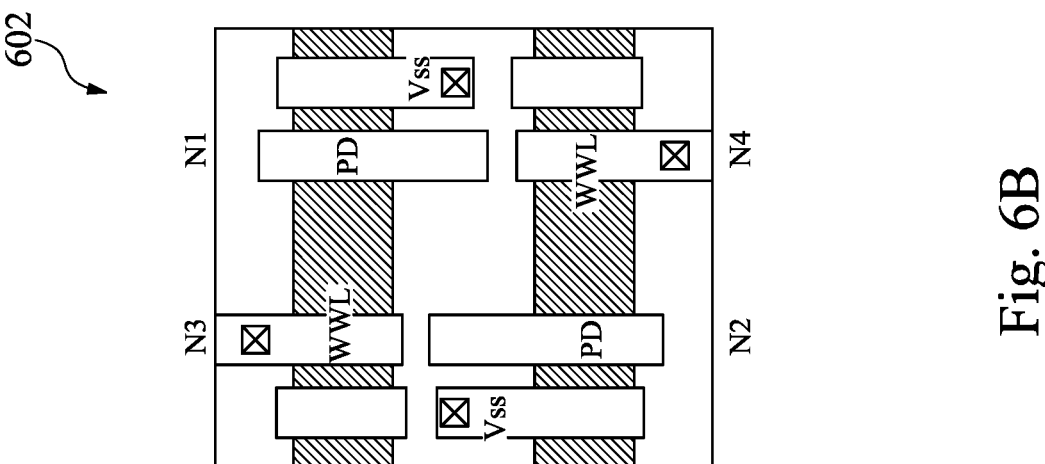
FIG. 6B is a schematic a bottom level transistor layout of the SRAM bit cell of FIG. 6A.
Figure 6A:
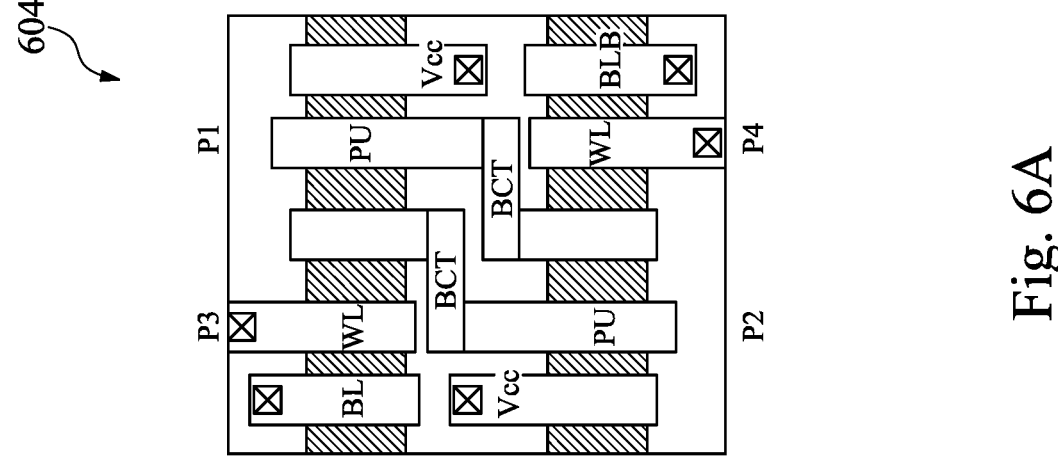
FIG. 6A is a schematic a top level transistor layout of a SRAM bit cell with circuit layout of FIG. 4 and implemented with stacked CFETs.

FIG. 6A is a schematic a top level transistor layout of a SRAM bit cell 600 with the circuit layout 400 of FIG. 4 and implemented with stacked CFETs. FIG. 6B is a schematic a bottom level transistor layout of the SRAM bit cell 600 of FIG. 6A. FIG. 6C is a schematic cross-sectional view of the SRAM bit cell 600 of FIG. 6A. The SRAM bit cell 600 is similar to the SRAM bit cell 500 except that p-type transistors are stacked above n-type transistors in the SRAM bit cell 600.

The SRAM bit cell 600 includes a first transistor level 602 and a second transistor level 604 formed above the first transistor level 602. The first transistor level 602 includes n-type transistors and the second transistor level 604 include p-type transistors. The SRAM bit cell 600 includes a front side interconnect structure 606 disposed above the second transistor level 604. In some embodiments, the SRAM bit cell 600 further includes a back side interconnect structure 608 disposed below the second transistor level 604.

As shown in FIG. 6B, four NMOS transistors N1, N2, N3, N4 are formed in the first transistor level 602. The transistors N1 and N2 in the first transistor level 604 function as the pull down transistors PD-1, PD-2 in the SRAM bit cell circuit layout 400 of FIG. 4. The transistors N1 and N2 are positioned in diagonally across from each other. The transistor N3, N4 function as the write enhance pass gate transistors WPG-1, WPG-2 in the SRAM bit cell circuit layout 400 of FIG. 4. The transistors N1, N3 share one common source/drain feature, which subsequently becomes a part of the data storage node Q. The transistors N2, N4 share one common source/drain feature, which subsequently becomes a part of the data bar storage node QB.

As shown in FIG. 6A, four PMOS transistors P1, P2, P3, P4 are formed in the second transistor level 604. The transistors P1 and P2 in the second transistor level 604 function as the pull up transistors PU-1, PU-2 in the SRAM bit cell circuit layout 400 of FIG. 4. In some embodiments, the transistors P1 and P2 are positioned in diagonally across from each other. The transistors P1, P3 share one common source/drain feature. The PMOS transistors P1, P2, P3, P4 are stacked over NMOS transistors N1, N2, N3, N4 the respectively. The transistors P1, P3 share a common source/drain feature, which subsequently becomes a part of the data storage node Q. Transistors P2, P4 share one common source/drain feature which subsequently becomes a part of the data bar storage node QB. The transistor P3, P4 function as the pass gate transistors PG-1, PG-2 in the SRAM bit cell circuit layout 400 of FIG. 4. The BCTs are formed in the second transistor level 604. In some embodiment, BCTs (butt connection terminals) between the source/drain features in the data storage node Q to the gate electrode of the pull up transistor PU-2/P2, and between the source/drain features in the data bar storage node QB to the gate electrode of the pull up transistor PU-1/P1.

The front side interconnect structure 606 is formed on the second transistor level 604 to provide power and signal to the transistors. In some embodiments, the front side interconnect structure 606 includes bit line BL, bit line bar BLB, a voltage supply line Vcc, and a word line WL. In some embodiments, the bit line BL, bit line bar BLB, and the voltage supply line Vcc are formed in a first metal layer, and extend along the same direction as the fin structures. In some embodiments, the voltage supply line Vcc may be positioned between the bit line BL and the bit line bar BLB. The word line WL may be disposed in a second metal layer, and extends along the same direction as the gate structures. In some embodiments, the second metal layer is above the first metal layer.

The back side interconnect structure 608 is formed on the back side to provide power and signal to the transistors. In some embodiments, the back side interconnect structure 608 includes a ground line Vss, and two write enhance word lines WWL. In some embodiments, the ground line Vss and the two write enhance word lines WWL are formed in the same metal layer and extend along the same direction as the fin structures. In some embodiments, the ground line Vss may be positioned between the two write enhance word lines WWL.

Various embodiments or examples described herein offer multiple advantages over the state-of-art technology. By including two write enhance pass gate transistors in a 6T stacked CFET SRAM cell, the strength of the pass gate can be flexibly modulated within the same footprint as the 6T stacked CFET SRAM cell. The write ability of the 6T stacked CFET SRAM are enhanced without traditional write assist techniques, thus without sacrificing the data stability.

It will be understood that not all advantages have been necessarily discussed herein, no particular advantage is required for all embodiments or examples, and other embodiments or examples may offer different advantages.

Some embodiments of the present provide a SRAM (static random access memory) bit cell, comprising a first inverter having a data storage node; a second inverter cross-coupled to the first inverter and having a data bar storage node; a first pass gate transistor coupled between the data storage node and a bit line conductor, wherein the first pass gate transistor includes a first gate terminal connected to a first word line conductor; a second pass gate transistor coupled between the data bar storage node and a bit line bar conductor, wherein the second gate transistor includes a second gate terminal connected to the first word line conductor; a third pass gate transistor coupled between the data storage node and the bit line conductor, wherein the third pass gate transistor includes a third gate terminal connected to a second word line conductor; and a fourth pass gate transistor coupled between the data storage bar node and the bit line bar conductor, wherein the fourth pass gate transistor includes a fourth gate terminal connected to the second word line conductor.

Some embodiments of the present disclosure provide a SRAM bit cell, comprising a p-type transistor level comprising: a first pull-up transistor; a second pull-up transistor; a first pass gate transistor; and a second pass gate transistor, wherein the first and second gate transistors are electrically connected to a first word line conductor; a n-type transistor level vertically stacked with the p-type transistor comprising: a first pull-down transistor aligned with the first pull-up transistor; a second pull-down transistor aligned with the second pull-up transistor; a third pass gate transistor aligned with the first pass gate transistor; and a fourth pass gate transistor aligned with the second pass gate transistor, wherein the third and fourth gate transistors are electrically connected to a second word line conductor.

Some embodiments of the present disclosure provide a method for operating a SRAM bit cell, comprising writing the SRAM bit cell by activating first, second, third and fourth pass gate transistors, wherein the first pass gate transistor is coupled between a data storage node and a bit line conductor, and the second pass gate transistor is coupled between a data bar storage node and a bit line bar conductor, the third pass gate transistor is coupled between the data storage node and the bit line conductor, and the fourth pass gate transistor is coupled between the data bar storage node and the bit line bar conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A SRAM (static random access memory) bit cell, comprising:
 a first inverter having a data storage node;
 a second inverter cross-coupled to the first inverter and having a data bar storage node;
 a first pass gate transistor coupled between the data storage node and a bit line conductor, wherein the first pass gate transistor includes a first gate terminal connected to a first word line conductor;
 a second pass gate transistor coupled between the data bar storage node and a bit line bar conductor, wherein the second gate transistor includes a second gate terminal connected to the first word line conductor;
 a third pass gate transistor coupled between the data storage node and the bit line conductor, wherein the third pass gate transistor includes a third gate terminal connected to a second word line conductor; and
 a fourth pass gate transistor coupled between the data storage bar node and the bit line bar conductor, wherein the fourth pass gate transistor includes a fourth gate terminal connected to the second word line conductor,
 wherein drains of the first and third pass gate transistors are coupled to the bit line bar conductor, and sources of the second and fourth pass gate transistors are coupled to the bit line bar conductor.

2. The SRAM bit cell of claim 1, wherein the first pass gate transistor and the second pass gate transistor are transistors of a first type, and the third pass gate transistors and the fourth pass gate transistors are transistors of a second type.

3. The SRAM bit cell of claim 2, wherein the first pass gate transistor and the second pass gate transistor are NMOS field effect transistors, and the third pass gate transistors and the fourth pass gate transistors are PMOS field effect transistors.

4. The SRAM bit cell of claim 2, wherein the first pass gate transistor and the second pass gate transistor are PMOS field effect transistors, and the third pass gate transistors and the fourth pass gate transistors are NMOS field effect transistors.

5. The SRAM bit cell of claim 2, wherein the first pass gate transistor and the third pass gate transistor are vertically stacked, and the second pass gate transistor and the fourth pass gate transistor are vertically stacked.

6. The SRAM bit cell of claim 5, wherein
 the first inverter comprises:
  a first pull up transistor; and
  a first pull down transistor, wherein the first pull up transistor and the first pull down transistor are vertically stacked; and
 the second inverter comprises:
  a second pull up transistor; and
  a second pull down transistor, wherein the second pull up transistor and the second pull down transistor are vertically stacked.

7. The SRAM bit cell of claim 6, wherein the first and second gate terminals are disposed on a front side to connect with a front side interconnect structure, and the third and fourth gate terminals are disposed on a back side to connect with a back side interconnect structure.

8. The SRAM bit cell of claim 1, wherein the first pass gate transistor and the third pass gate transistor have a same channel width.

9. A SRAM bit cell, comprising:
a first inverter having a data storage node, wherein the first inverter comprises:
a first pull-up transistor; and
a first pull-down transistor;
a second inverter cross-coupled to the first inverter and having a data bar storage node, wherein the second inverter comprises:
a second pull-up transistor; and
a second pull-down transistor;
a first pass gate transistor coupled between the data storage node and a bit line conductor, wherein the first pass gate transistor includes a first gate terminal connected to a first word line conductor;
a second pass gate transistor coupled between the data bar storage node and a bit line bar conductor, wherein the second gate transistor includes a second gate terminal connected to the first word line conductor;
a third pass gate transistor coupled between the data storage node and the bit line conductor, wherein the third pass gate transistor includes a third gate terminal connected to a second word line conductor; and
a fourth pass gate transistor coupled between the data storage bar node and the bit line bar conductor, wherein the fourth pass gate transistor includes a fourth gate terminal connected to the second word line conductor,
wherein the first pass gate transistor and the third pass gate transistor are complementary transistors;
wherein drains of the first and third pass gate transistors are coupled to the bit line bar conductor, and sources of the second and fourth pass gate transistors are coupled to the bit line bar conductor.

10. The SRAM bit cell of claim 9, wherein the first pull-up transistor and second pull-up transistor are formed in a p-type transistor level, and the first pull-down transistor and the second pull-down transistor are formed in a n-type transistor level.

11. The SRAM bit cell of claim 10, wherein the first pull up transistor and the first pull down transistor are vertically stacked, and the second pull up transistor and the second pull down transistor are vertically stacked.

12. The SRAM bit cell of claim 11, wherein the first pass gate transistor and the third pass gate transistor are complementary transistors.

13. The SRAM bit cell of claim 12, wherein the first pass gate transistor is formed in the p-type transistor level and the third pass gate transistor is formed in the n-type transistor level.

14. A SRAM bit cell, comprising:
a first inverter having a data storage node;
a second inverter cross-coupled to the first inverter and having a data bar storage node;
a first pass gate transistor coupled between the data storage node and a bit line conductor, wherein the first pass gate transistor includes a first gate terminal connected to a first word line conductor;
a second pass gate transistor coupled between the data bar storage node and a bit line bar conductor, wherein the second gate transistor includes a second gate terminal connected to the first word line conductor;
a third pass gate transistor coupled between the data storage node and the bit line conductor, wherein the third pass gate transistor includes a third gate terminal connected to a second word line conductor; and
a fourth pass gate transistor coupled between the data storage bar node and the bit line bar conductor, wherein the fourth pass gate transistor includes a fourth gate terminal connected to the second word line conductor,
wherein the first pass gate transistor and the second pass gate transistor are transistors of a first type, and the third pass gate transistors and the fourth pass gate transistors are transistors of a second type,
wherein drains of the first and third pass gate transistors are coupled to the bit line bar conductor, and sources of the second and fourth pass gate transistors are coupled to the bit line bar conductor.

15. The SRAM bit cell of claim 14, wherein the first pass gate transistor and the second pass gate transistor are NMOS field effect transistors, and the third pass gate transistors and the fourth pass gate transistors are PMOS field effect transistors.

16. The SRAM bit cell of claim 14, wherein the first pass gate transistor and the second pass gate transistor are PMOS field effect transistors, and the third pass gate transistors and the fourth pass gate transistors are NMOS field effect transistors.

17. The SRAM bit cell of claim 14, wherein the first pass gate transistor and the third pass gate transistor have a same channel width.

18. The SRAM bit cell of claim 17, wherein
the first inverter comprises:
a first pull up transistor; and
a first pull down transistor, wherein the first pull up transistor and the first pull down transistor are vertically stacked; and
the second inverter comprises:
a second pull up transistor; and
a second pull down transistor, wherein the second pull up transistor and the second pull down transistor are vertically stacked.

19. The SRAM bit cell of claim 18, wherein the first and second gate terminals are disposed on a front side to connect with a front side interconnect structure, and the third and fourth gate terminals are disposed on a back side to connect with a back side interconnect structure.

20. The SRAM bit cell of claim 14, wherein the first pass gate transistor and the third pass gate transistor are complementary transistors.

* * * * *